United States Patent [19]
Arz et al.

[11] Patent Number: 6,157,280
[45] Date of Patent: Dec. 5, 2000

[54] SWITCHABLE GRADIENT COIL ARRANGEMENT

[75] Inventors: Winfried Arz, Erlangen; Lothar Regenfus, Neunkirchen; Franz Schmitt, Erlangen, all of Germany

[73] Assignee: Siemens Aktiengesellschaft, Munich, Germany

[21] Appl. No.: 09/436,519

[22] Filed: Nov. 9, 1999

[30] Foreign Application Priority Data

Nov. 9, 1998 [DE] Germany .............................. 198 51 582

[51] Int. Cl.[7] ...................................................... H01F 5/00
[52] U.S. Cl. ............................................ 335/299; 324/320
[58] Field of Search ................................... 335/216, 299, 335/296, 301; 324/318–321

[56] References Cited

U.S. PATENT DOCUMENTS

| | | | |
|---|---|---|---|
| 4,520,315 | 5/1985 | Loeffler et al. ........................ | 324/309 |
| 4,991,586 | 2/1991 | Mueller et al. ..................... | 128/653 AF |
| 5,345,178 | 9/1994 | Manabe et al. .......................... | 324/320 |
| 5,349,318 | 9/1994 | Inoue ....................................... | 335/299 |
| 5,736,865 | 4/1998 | Katznelson et al. . | |

*Primary Examiner*—Lincoln Donovan
*Assistant Examiner*—Tuyen T. Nguyen
*Attorney, Agent, or Firm*—Hill & Simpson

[57] ABSTRACT

A switchable gradient coil arrangement for a magnetic resonance tomography apparatus, has conductor ends in the primary plane (or planes) that can be differently connected to one another and/or to conductor ends in the secondary plane (or planes) to form respective coil arrangements having different field qualities/performance features. The connections are produced by a switch system composed of standard switches for the logical interconnection of the individual sub-coils, in the form of at least four bipolar switches. One of these switches, as a power connection switch connects the ends of each sub-coil to the power terminals, one switch is connected parallel to the sub-coil, and at least one switch is arranged in a connection branch that branches for optional connection to other sub-coils.

8 Claims, 6 Drawing Sheets

SWITCHABLE GRADIENT COIL ARRANGEMENT

BACKGROUND OF THE INVENTION

1. Field of the Invention

The present invention is directed to a gradient coil arrangement for a magnetic resonance tomography apparatus, for generating transverse or longitudinal gradient fields.

2. Description of the Prior Art

The required performance capability of a gradient coil is essentially dependent on the type of MR imaging. Conventional MR imaging usually requires a good linearity volume (~5% in the linearity volume of 40–50 cm) with moderate gradient strength (10–20 mT/m) and switching times (~1 ms). For fast MR imaging, high amplitude gradients (20–40 mT/m) are switched very fast (100–500 μs). As a result, side affects in the form of peripheral muscle stimulations can occur. In order to avoid these effects, the linearity volume of the gradient coils is generally reduced, which leads to a reduction of the maximum field boosts, and thus also leads to a reduction of the stimulation risk (the maximum field boost, in addition to other aspects, determines the stimulation risk). Given rapidly switched gradient coils, the linearity volume can thus diminish very quickly from, typically, 40–50 cm to 20 cm DSV. A coil having such properties is usually not suited for conventional whole-body applications, but is suitable for fast MR imaging techniques such as EP, RARE, HASTE, GRASE, etc. The speed is the important advantage.

Another reason for different field qualities is that the linearity generally decreases with the distance from the center when a gradient coil is designed for a specific volume. The human body, however, does not necessarily follow this rule. For example, the shoulders are located in this region. Given exposures of the spinal column, it is often meaningful to image the entire spinal column without repositioning. Dependent on the positioning of the center, the cervical and/or lumbar vertebra lie in the region of the greatest non-linearities. Image distortions are therefore unavoidable. Due to the smaller diameter of the coil, there is a smaller homogeneity volume for head gradient coils. This only allows the imaging of parts of the brain but not the imaging of the cervical spinal column. Therefore it can be desirable for the radiologist to switch from a central FOV to a displaced FOV. This, however, has not been hitherto possible. Only embodiments of the one or other type exist.

In order to avoid defining the field quality that the gradient coil arrangement should have at the time of manufacture which would result in an inflexible system unable to meet the differing needs of various customers, a magnetic resonance imaging system is disclosed in German OS 195 40 746 wherein a modular gradient system is employed, which combines a conventional and a fast gradient coil system in one coil body. The conventional gradient system has a large linearity volume that, however, can only be slowly switched and, moreover, only allows medium gradient amplitudes. The fast gradient system, by contrast, exhibits a smaller linearity volume but instead allows faster switching of very high gradient amplitudes. Fundamentally, however, this is nothing more than the combination of two completely separate gradient coil systems that are merely wound on the one and the same tubular carrier, with a series connection or parallel connections also being possible in addition to the separate drive of these gradient coil systems.

U.S. Pat. No. 5,349,318 discloses a gradient coil arrangement wherein conductors of the gradient coil are arranged essentially in a primary plane, which is an inner cylindrical envelope, and in a secondary plane, which is an outer cylindrical envelope which concentrically surrounds the inner cylindrical envelope. Each conductor arrangement of the respective two cylindrical envelopes contains a sub-coil having a helical conductor arrangement as well as a number of sub-coils having a horseshoe-shaped conductor arrangement. The open conductor ends of the sub-coils are firmly connected to one another, via conductive connecting wires, at an end side between the two cylindrical envelopes, the connecting wires being, for example, soldered to the coil conductor ends. The field quality of the gradient coil arrangement is thus also defined and is invariable.

SUMMARY OF THE INVENTION

An object of the present invention is based on the object of fashioning a gradient coil arrangement that comprises sub-coils such that a different interconnection of the sub-coils to One another is possible in an especially versatile way given a simple structure.

This object is inventively achieved in a gradient coil arrangement having sub-coils arranged in a primary plane, further sub-coils arranged in a secondary plane, the primary and the secondary planes being radially spaced form each other, the sub-coils have a number of open conductor ends. At least one switch system, composed of standard switches is provided, having at least four bipolar switches for logical interconnection of sub-coils, with one of the switches, as a power connection switch, connecting one of the conductor ends of one of the sub-coils to a power terminal. One of the switches is connected in parallel with the sub-coil, and one of the switches is arranged in a connection branch for optional connection to other sub-coils, this connection branch branching between one of the power connection switches and an appertaining conductor end of the sub-coil. The standard switch system is designed to be switchable for forming gradient coil arrangements having different field qualities/conduction features such that conductor ends in the primary plane are connectable to conductor ends in the secondary plane and/or conductor ends within one of the planes are connectable to one another.

As a result of this inventive connection of a standard switch system, the individual sub-coils (a sub-coil can comprise only a single turn) can be interconnected to one another in a very versatile manner, and individual sub-coils also can be completely suppressed in terms of their effect by the bridging switches, so that different optimum gradient coil arrangements that can be made especially appropriate for respective different specific examination types can be produced at the installed apparatus dependent on the desired application.

A static interconnection of the gradient coil arrangement with the inventive switch arrangement before an examination sequence, as well as a dynamic interconnection during the examination sequence, are possible. Switches that are mechanical switches actuatable by gas or liquid, particularly the coolant of the gradient coil arrangement, or electrically operated contactors, are suitable for a static interconnection. If such contactors are disposed in the stray gradient field, they can be fashioned without their own excitation winding.

Particularly for dynamic switching during an examination sequence, the bipolar switches are preferably semiconductor switch elements that are capable of operating in a magnetic field, preferably containing IGBTs and/or thyristors.

The bipolar switches can be at least partially annularly arranged at an end face of the gradient coil both inside as well as outside the casting of the gradient coil. For specific applications, a conductive coolant is employed that is utilized for switching the bipolar switches.

DESCRIPTION OF THE PREFERRED EMBODIMENTS

Figure 1:
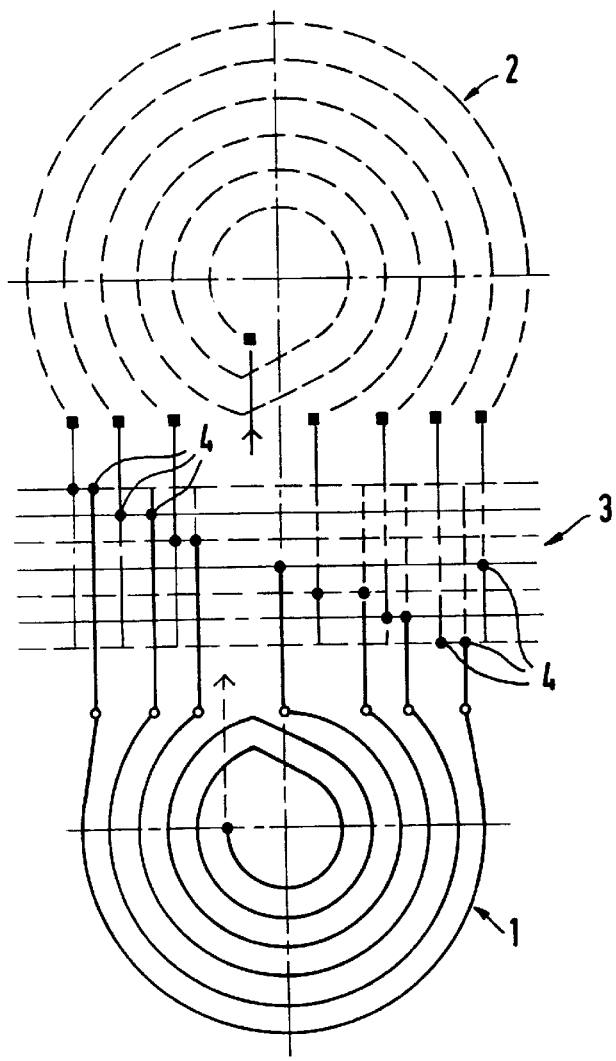
FIG. 1 is an "unfolded," open illustration of a coil in the primary plane and in the secondary plane with a network-like interconnection of the windings to one another, in accordance with the invention.

In an "unfolded," open view, FIG. 1 shows a coil 1 of the primary winding of a gradient coil and a coil 2 of the secondary winding that are connected to one another by a network 3. Respective winding ends of the sub-coils of the primary coil 1 are thereby connected to ends of windings of the sub-coils of the secondary coil 2. The linkage points 4 are such that two respective linkage points 4 lying on the same horizontal line are connected to one another by switch arrangements, to be described in detail later.

Figure 2:
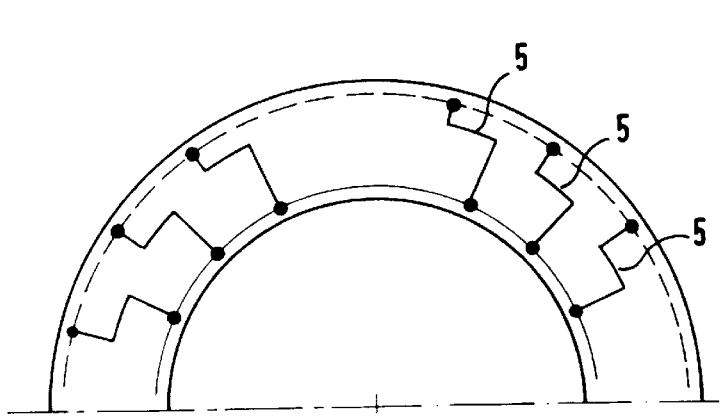
FIG. 2 is a schematic illustration of the interconnection on the basis of a rigid configuration of the conductor loops according to a customer's needs.
Figure 3:
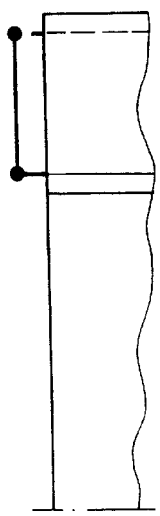
FIG. 3 is a side view of the statically interconnected end face of the gradient coil arrangement according to FIG. 2.

FIGS. 2 and 3 schematically show the simplest case of a customized interconnection using fixed switch bridges (jumpers) 5. These are selected such that an optimally adapted gradient coil arrangement is achieved in a customer-specific fashion. This, however, does not enable any modification except on the basis of a relatively complicated, differently configured fixed interconnection.

The fundamental basis of the present invention, however, is the design of a switch system which allows completely different gradient coil configurations to be selectively formed at the customer (installation site) and thus allows the imaging properties to be optimally adapted to the respectively desired examination conditions for every examination.

Figure 4:
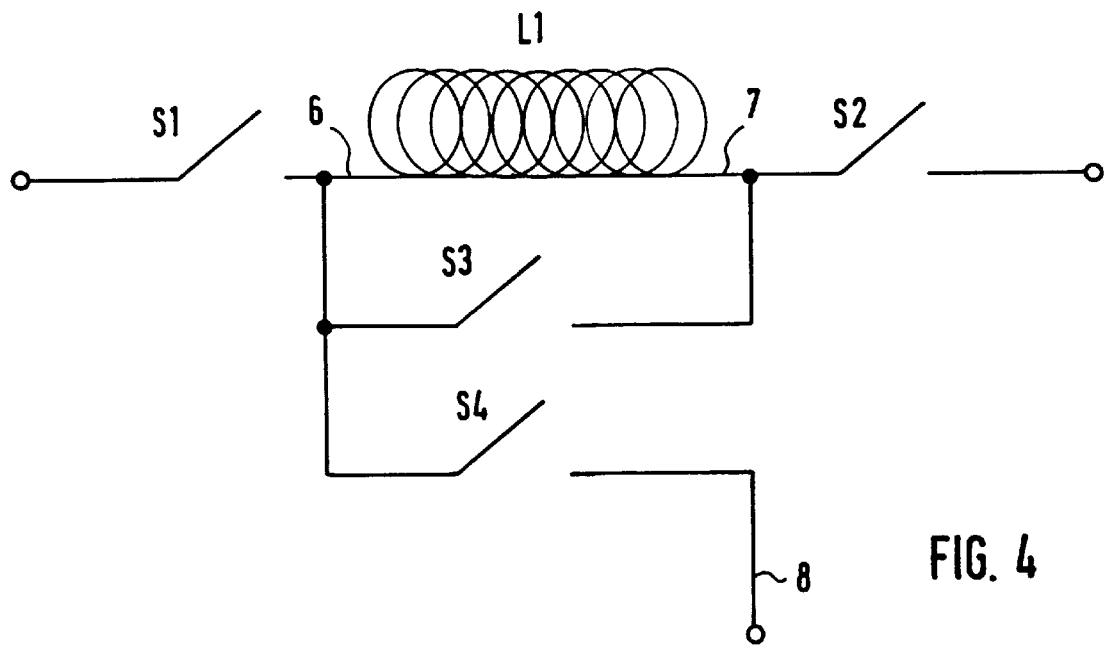
FIG. 4 shows an exemplary embodiment of an inventive, switch system composed of standard switches, for the logical interconnection of a sub-coil to a plurality of further sub-coils.

To this end, a switch system composed of standard switches (switch elements) is inventively provided for each sub-coil, as shown in FIG. 4 in an exemplary embodiment. The sub-coil L1, which, of course, can represent only a single turn, is thereby provided with four bipolar switches S1 through S4, of which the switches S1 and S2 (as power connection switches) connect the ends 6 and 7 of the sub-coil L1 to the two power terminals of the respective gradient coil.

Figure 5:
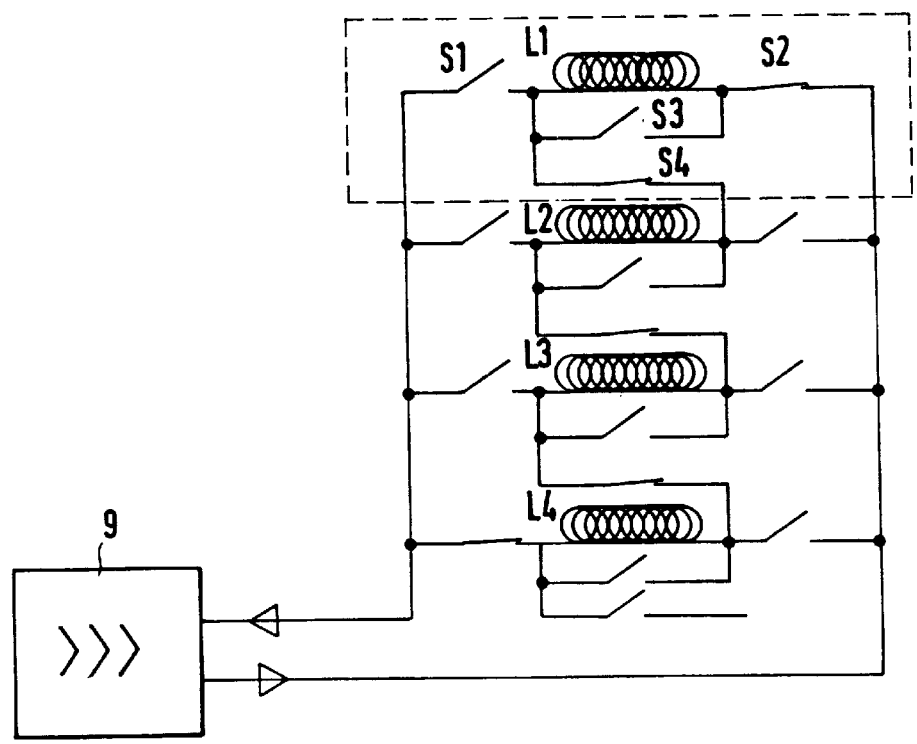
FIG. 5 shows an interconnection of four sub-coils of the standard switch module according to FIG. 4.

The switch S3 is connected in parallel with the sub-coil L1 and thus can bridge it, and thus suppress it in terms of its effect. The switch S4 lies in a connecting branch 8 for optional connection to other sub-coils. An interconnection composed of four such sub-coils L1 through L4 with the switch system of FIG. 4 is shown in FIG. 5.

The following chart represents the three global switch conditions of each bipolar switch for series connection, parallel connection and bypass given a circuit arrangement according to FIG. 4.

|  | S1 | S2 | S3 | S4 |
|---|---|---|---|---|
| Parallel | 1 | 1 | 0 | 0 |
| Series | 0 | 1 | 0 | 1 |
| Bypass | 0/1 | 0/1 | 1 | 1 |

In the above chart, "1" denotes that the respective switch is closed, and "0" denotes that the switch is open. The combination 0/1 indicates that either one of the two states is possible.

Figure 6:
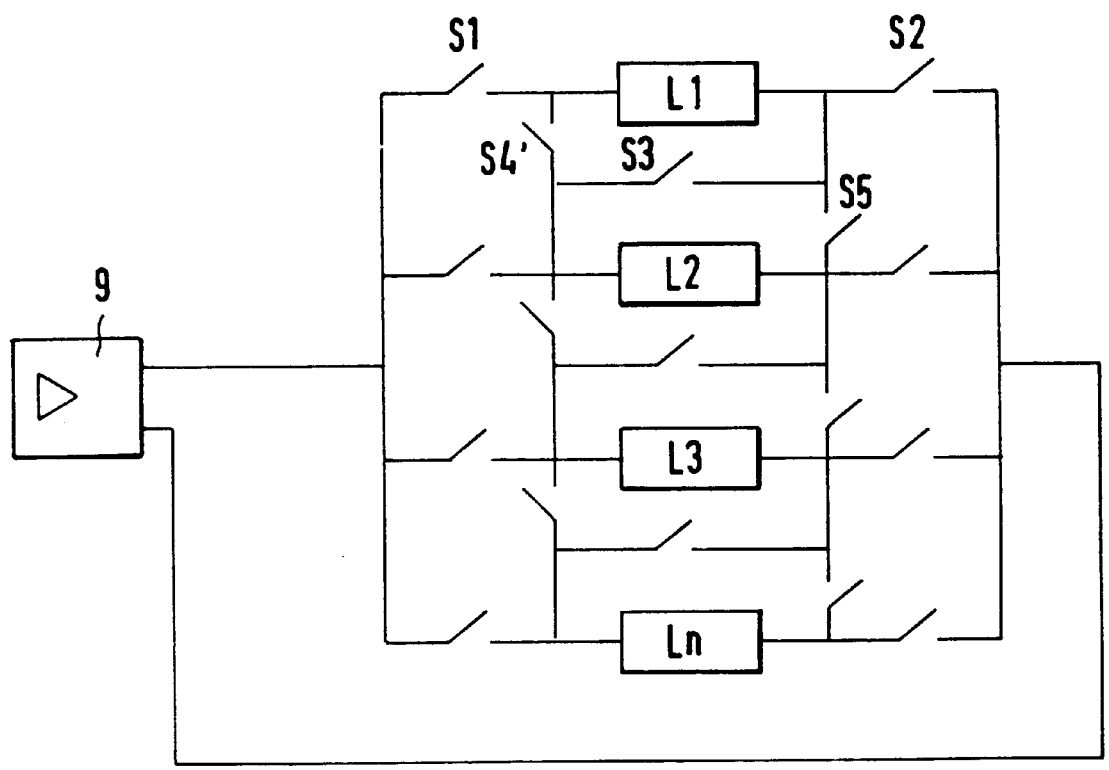
FIG. 6 shows an alternative inventive interconnection of four sub-coils with a modified switch module having five standard bipolar switches per sub-coil.

FIG. 6 shows an alternative interconnection wherein each switch system for the interconnection of a sub-coil L1 through Ln has five bipolar switches S1, S2, S3, S4' and S5. This enables a number of further combinations of series and parallel connection of the sub-coils. A gradient amplifier is indicated at 9.

Figure 7:
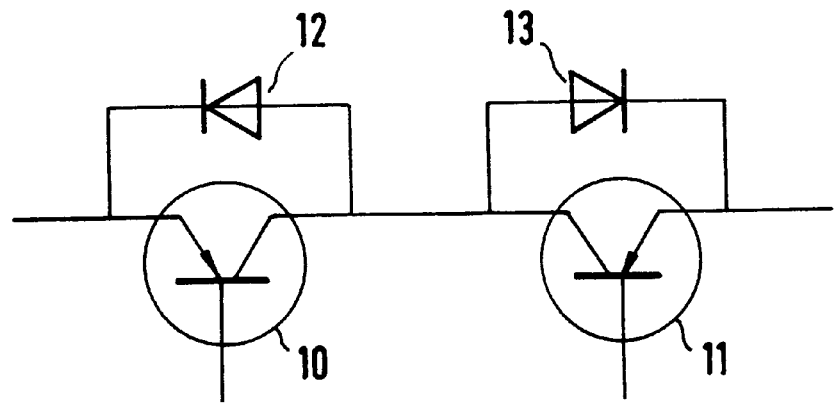
FIG. 7 is a circuit diagram of a bipolar switch fashioned as semiconductor switch.

FIG. 7 shows the fashioning of bipolar switch, such as any of switches S1 through S5, as a semiconductor switch with two IGBTs 10 and 11 that are respectively bridged by diodes 12 and 13 having different polarities.

The topology illustration in FIGS. 4, 5 and 6 is subject to various demands dependent on whether the switch elements are switched fast or slow. Given a dynamic switching, i.e., a modification of the gradient coil arrangement during the execution of a sequence, this can only ensue with semiconductors, as shown in FIG. 7 on the basis of an exemplary embodiment. The aforementioned IGBTs are preferably employed since they can switch high currents and voltages, however, the employment of thyristors is also possible since the switching can occur given no current (or given extremely small offset currents).

Figure 8:
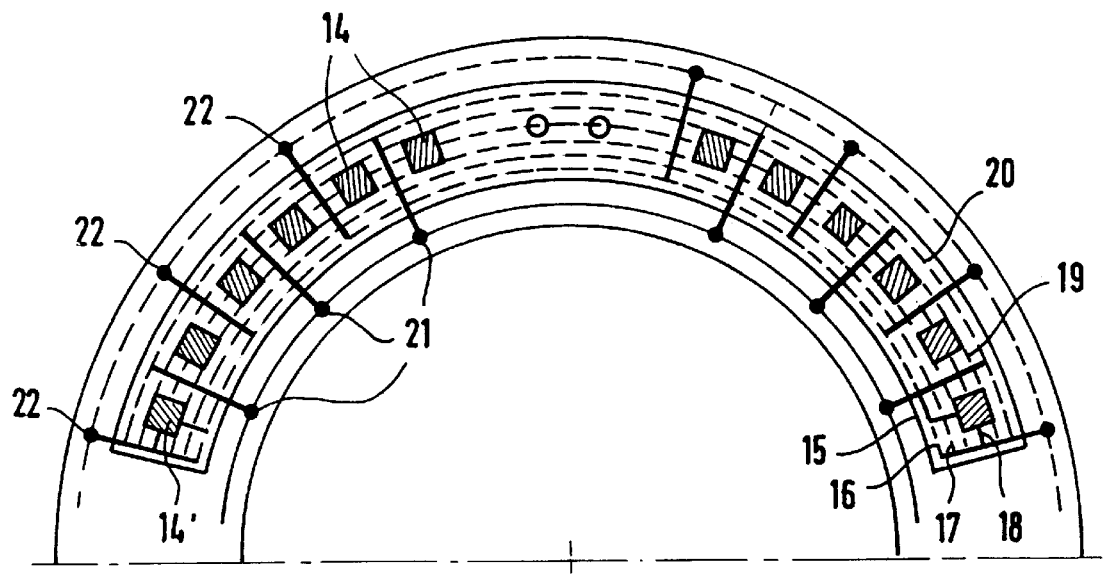
FIG. 8 is a schematic end face view of an inventive gradient coil arrangement having a motherboard with a number of electrical switch elements for interconnection of the ends of the windings of the sub-coils, indicated as points.
Figure 9:
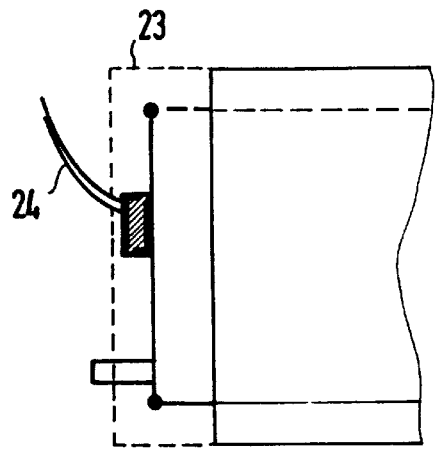
FIG. 9 is a side view of the arrangement according to FIG. 1, wherein the contacts lie at the outside of the casting for the gradient coil.
Figure 10:
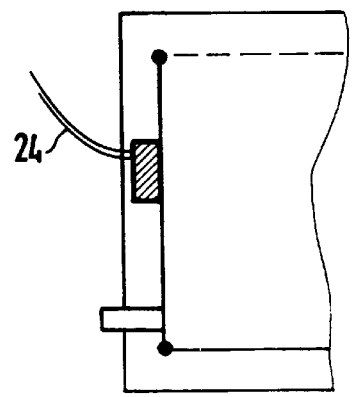
FIG. 10 is a side view of the arrangement according to FIG. 1, wherein the contacts are embedded in the casting for the gradient coil.

FIGS. 8 through 10 schematically show the design of the switch system using electrical switch elements. The electrical switch elements 14, in combination with a motherboard 15 having a number of current interconnects 16 through 20, serve for different interconnections of the sub-coils indicated with their winding ends 21 and 22 at the end face of the gradient coil arrangement. In the side view of FIG. 9, the interconnection is arranged outside the casting of the gradient coil within a cover 23, whereas, given the arrangement according to FIG. 10, the electrical switch elements lie inside the casting of the gradient coil and only the control lines 24 are conducted toward the outside. A structure is also possible wherein a number of motherboards lying above one another control the course of the current.

Figure 11:
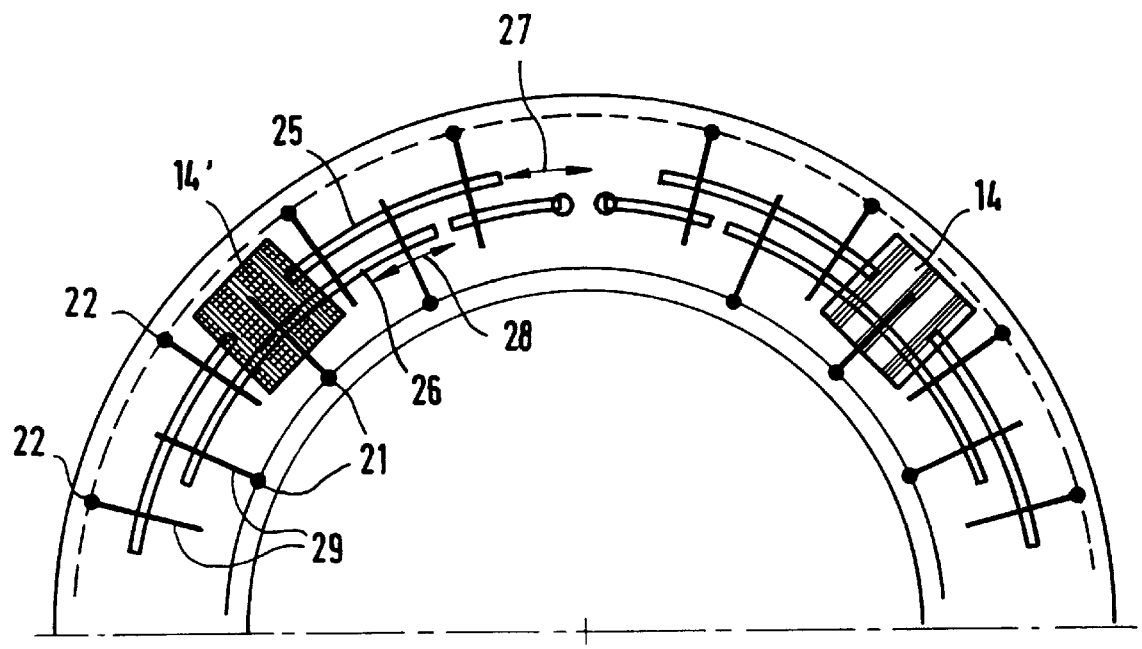
FIG. 11 shows an end face view of an inventive gradient coil arrangement having mechanical switch elements for different interconnection of the ends of the windings of the sub-coils group-by-group.
Figure 12:
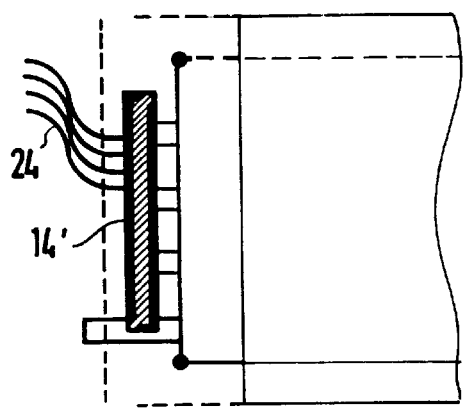
FIG. 12 is a side view of the coil arrangement according to FIG. 11.

FIGS. 11 and 12 show an exemplary embodiment having a mechanical design of the switches. The mechanical switch element 14' serves the purpose of displacing contact springs 25 and 26 composed, for example, of copper along the double arrows 27 and 28. These contact springs 25 and 26 in FIG. 11 glide under the contact webs connected to the respective winding ends 21 and 22. Different groups of contact webs 29 are electrically contacted dependent on the position of the contact springs 25 and 26 and, accordingly, the corresponding windings are connected to one another.

Figure 13:
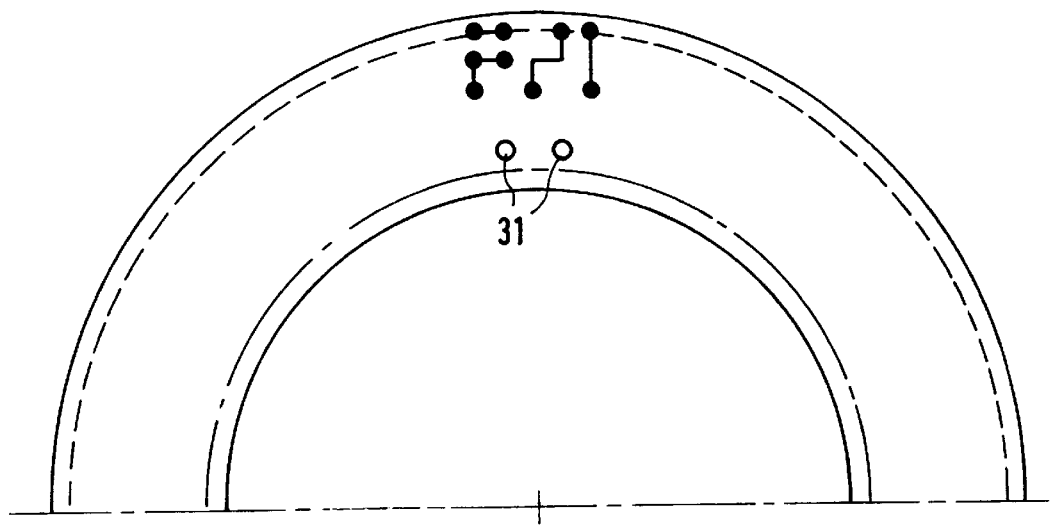
FIG. 13 is a schematic view of a Z-coil with interrupted sub-coils and control lines pulled out and interconnectable in different ways in accordance with the invention.
Figure 14:
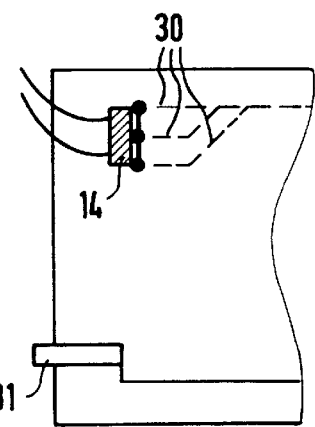
FIG. 14 is a side view of the arrangement of FIG. 1 with switch elements that are cast with the gradient coil arrangement.
Figure 15:
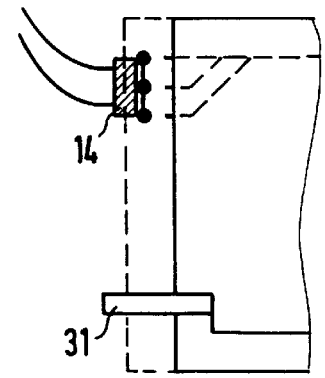
FIG. 15 is a side view of the arrangement of FIG. 1 with switch elements that are disposed outside of the casting of the gradient coil arrangement.

FIGS. 13 through 15 show an exemplary application of the inventive interconnection for Z-coils, wherein the switch elements are integrated in the casting in FIG. 14 and are arranged outside the casting of the gradient coil in FIG. 15. The individual sub-coils of the separated Z-coils are thereby pulled forward toward the face end in the secondary plane with control lines 30 so that they are connectable to one another in different ways by bridges indicated in FIG. 13 that, in reality of course, are fashioned with inventive switch systems. This division and different interconnectability is thereby provided only at the secondary coil but not at the primary coil in the exemplary embodiment of FIGS. 13 and 15. The two terminals 31 thereof are connected to the corresponding gradient coil amplifiers in an unmodified way.

Figure 16:
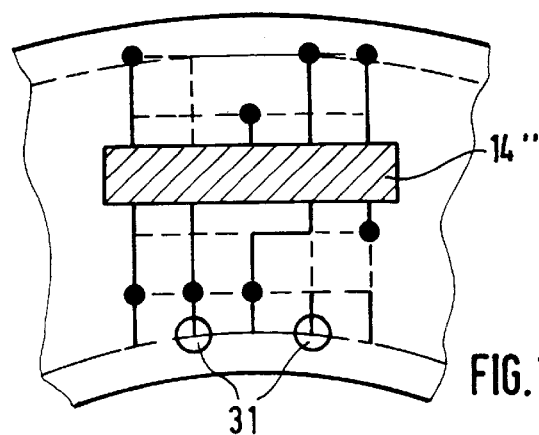
FIGS. 16 and 17 respectively show a partial end face view and a view of an embodiment of the invention for a Z-coil arrangement, wherein the windings of the primary coil as well as of the secondary coil are interconnectable to one another in an arbitrary way.
Figure 17:
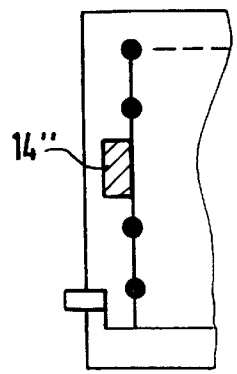

FIGS. 16 and 17, by contrast, show an exemplary embodiment wherein the windings of the secondary coil of the Z-coil arrangement as well as of the primary coil are connectable to and with one another in different ways via a switch array 14". The points thereby respectively represent possible linkage locations.

Although modifications and changes may be suggested by those skilled in the art, it is the intention of the inventors to embody within the patent warranted hereon all changes and modifications as reasonably and properly come within the scope of their contribution to the art.

We claim as our invention:

1. A gradient coil arrangement for a magnetic resonance tomography apparatus for selectively generating transverse and longitudinal gradient fields, comprising:

a first set of sub-coils disposed in a primary plane;

a second set of sub-coils disposed in a secondary plane, said secondary plane being radially spaced from said primary plane;

each sub-coil in said first set of sub-coils and said second set of sub-coils having open conductor ends which are respectively free for making connections thereto;

a switch system composed of a plurality of standard switches, including at least four bipolar switches for logically interconnecting respective sub-coils in said first and second sets of sub-coils;

a first of said bipolar switches comprising a power connection switch for connecting one of said conductor ends of one of said sub-coils to a power terminal;

a second of said bipolar switches being connected in parallel with one of said sub-coils;

a connecting branch, containing at least one of said switches, for selectively connecting respective sub-coils to each other, said connecting branch branching between said power connection switch and a conductor end of one of said sub-coils; and said switch system being operable for selectively connecting said conductor ends of said first set of sub-coils to conductor ends of said second set of sub-coils and for selectively connecting conductor ends of said first set of sub-coils to each other and for selectively connecting conductor ends of said second set of sub-coils to each other, to selectively form different gradient coil arrangements with different field qualities and performance characteristics.

2. A gradient coil arrangement as claimed in claim 1 wherein said switch system statically actuates said bipolar switches.

3. A gradient coil arrangement as claimed in claim 2 wherein said bipolar switches comprise fluid-actuated, mechanical switches.

4. A gradient coil arrangement as claimed in claim 1 wherein said bipolar switches comprise electrically operated contactors.

5. A gradient coil arrangement as claimed in claim 4 wherein said first set of sub-coils and said second set of sub-coils, when actuated, produce a stray gradient field, and wherein said contactors do not have an excitation winding disposed in said stray gradient field.

6. A gradient coil arrangement as claimed in claim 1 wherein said bipolar switches comprise semiconductor switches operable in a magnetic field.

7. A gradient coil arrangement as claimed in claim 6 wherein said semiconductor switches contain switch elements selected from the group consisting of IGBTs and thyristors.

8. A gradient coil arrangement as claimed in claim 1 wherein said primary plane and said secondary plane form an end face, and wherein at least some of said bipolar switches are annularly disposed at said end face.

* * * * *